US007179760B2

(12) United States Patent
Conti et al.

(10) Patent No.: US 7,179,760 B2
(45) Date of Patent: Feb. 20, 2007

(54) BILAYER CAP STRUCTURE INCLUDING HDP/BHDP FILMS FOR CONDUCTIVE METALLIZATION AND METHOD OF MAKING SAME

(75) Inventors: Richard A. Conti, Katonah, NY (US); Thomas F. Houghton, Marlboro, NY (US); Michael F. Lofaro, Hopewell Junction, NY (US); Jeffery B. Maxson, New Windsor, NY (US); Ann H. McDonald, New Windsor, NY (US); Yun-Yu Wang, Poughquag, NY (US); Keith Kwong Hon Wong, Wappingers Falls, NY (US); Daewon Yang, Hopewell Junction, NY (US)

(73) Assignee: International Buisness Machines Corporation, Armonk, NY (US)

( * ) Notice: Subject to any disclaimer, the term of this patent is extended or adjusted under 35 U.S.C. 154(b) by 0 days.

(21) Appl. No.: 10/908,833

(22) Filed: May 27, 2005

(65) Prior Publication Data

US 2006/0270245 A1 Nov. 30, 2006

(51) Int. Cl.
*H01L 21/31* (2006.01)
*H01L 21/469* (2006.01)
(52) U.S. Cl. .................... 438/788; 438/792
(58) Field of Classification Search ............. 438/788, 438/792, 771, 778
See application file for complete search history.

(56) References Cited

U.S. PATENT DOCUMENTS

| 5,968,610 | A | * | 10/1999 | Liu et al. ............... 438/435 |
| 6,153,523 | A | | 11/2000 | Van Ngo et al. |
| 6,372,291 | B1 | | 4/2002 | Hua et al. |
| 6,482,755 | B1 | | 11/2002 | Ngo et al. |
| 6,756,293 | B2 | * | 6/2004 | Li et al. ............... 438/595 |
| 6,809,022 | B2 | * | 10/2004 | Liu et al. ............... 438/622 |
| 6,825,561 | B1 | | 11/2004 | Agarwala et al. |
| 2003/0013449 | A1 | | 1/2003 | Hose et al. |
| 2003/0049388 | A1 | | 3/2003 | Cho et al. |
| 2004/0115873 | A1 | | 6/2004 | Chen et al. |
| 2004/0173907 | A1 | | 9/2004 | Chen et al. |

* cited by examiner

Primary Examiner—Hsien-Ming Lee
(74) Attorney, Agent, or Firm—Scully, Scott, Murphy & Presser, P.C.; Lisa U. Jaklitsch, Esq.

(57) ABSTRACT

The present invention relates to a bilayer cap structure for interconnect structures that comprise copper metallization or other conductive metallization. Such bilayer cap structure includes a first cap layer formed by an unbiased high density plasma (HDP) chemical vapor deposition process, and a second cap layer over the first cap layer, where the second cap layer is formed by a biased high density plasma (bHDP) chemical vapor deposition process. During the bHDP chemical vapor deposition process, a low AC bias power is applied to the substrate to increase the ion bombardment on the substrate surface and to induce resputtering of the capping material, thereby forming a seamless second cap layer with excellent reactive ion etching (RIE) selectivity.

15 Claims, 6 Drawing Sheets

BILAYER CAP STRUCTURE INCLUDING HDP/BHDP FILMS FOR CONDUCTIVE METALLIZATION AND METHOD OF MAKING SAME

FIELD OF THE INVENTION

This invention relates to high speed semiconductor microprocessors, application-specific integrated circuits (ASICs), and other high speed integrated circuit devices that contain conductive metallization. More specifically, the present invention relates to a bilayer cap structure having a first cap layer formed by an unbiased high density plasma (HDP) chemical vapor deposition process and a second cap layer formed by a biased high density plasma (bHDP) chemical vapor deposition process, as well as a method of forming such a bilayer cap structure.

BACKGROUND OF THE INVENTION

While aluminum-based metallurgies have been the material of choice for forming metal interconnects for semiconductor devices in the past, concern has grown as to whether aluminum will meet the demands required as circuit density and speeds for semiconductor devices increase.

Other metals have therefore been investigated as possible replacements for aluminum-based metallurgies. One highly advantageous material now being considered as a potential replacement for aluminum metallurgies is copper, because of its low susceptibility to electromigration failure and its high conductivity, in comparison with aluminum.

However, copper suffers from a significant disadvantage: it readily diffuses into the surrounding dielectric material during subsequent processing steps and causes deleterious leakage between adjacent interconnect lines.

To inhibit the diffusion of copper, protective barrier layers are often used to isolate the copper interconnects from the surrounding dielectric material. For example, a conductive liner formed of a diffusion barrier material, such as tantalum, titanium, tungsten, and alloys or nitrides thereof, is provided along the sidewalls and bottom of the copper interconnect. Further, a dielectric diffusion barrier material, such as silicon nitride ($Si_3N_4$), is typically employed to cap the upper surface of the copper interconnect.

Silicon nitride capping layers formed by high density plasma chemical vapor deposition (HDP CVD) process exhibit superior electromigration protection characteristics by effectively stopping the movement of copper atoms along the interconnect surface in the cap layers. Further, such HDP CVD $Si_3N_4$ cap layers exhibit superior adhesion characteristics to the underlying copper metallization.

Figure 1:
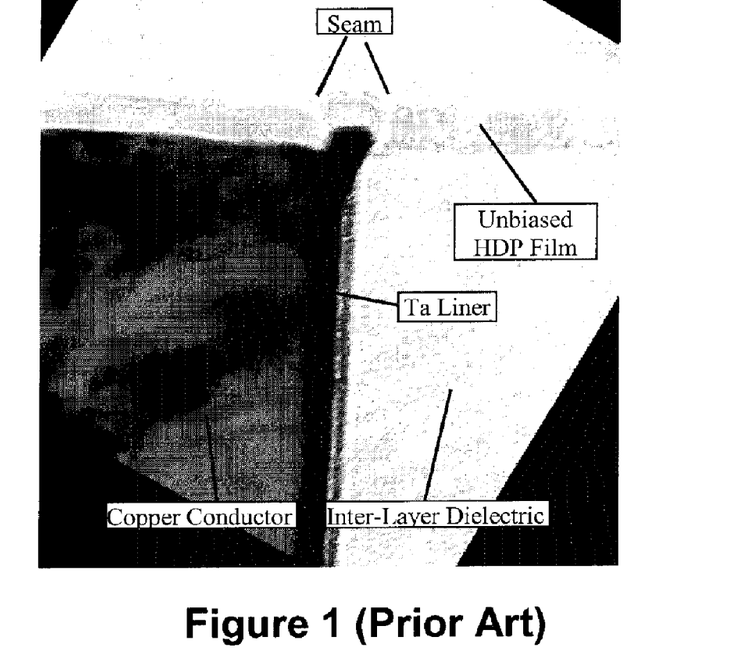
FIG. 1 shows a side-view transmission electron microscopy (TEM) picture of a prior art interconnect structure having a HDP cap layer formed over a copper conductor embedded in an inter-layer dielectric material, with a tantalum liner therebetween.

However, a silicon nitride film formed by a conventional HDP CVD process is characterized by a columnar growth pattern, as shown in FIG. 1. Specifically, the film grows only in an upward or vertical direction from the substrate surface, with little or no lateral growth. Because the underlying interconnect surface often contains one or more micro-steps (i.e., microscopic ledges or offsets that resemble steps of a stairway), either between the top surfaces of different device components, or at the copper grain boundary on the copper metallization, the columnar growth pattern of the HDP CVD film inevitably results in a seam (i.e., a gap or cavity) along each micro-step.

Figure 2:
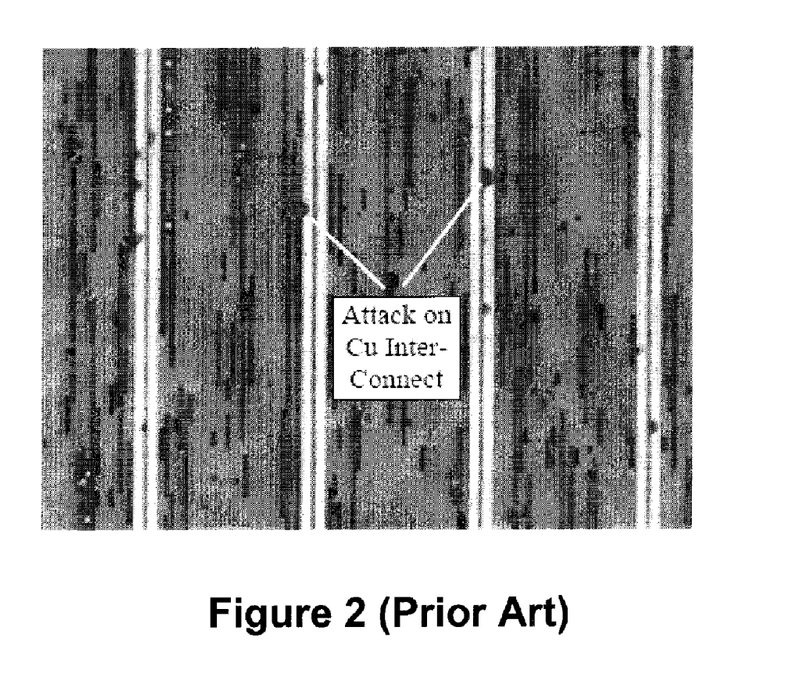
FIG. 2 shows a top-view microscopic picture of a prior art interconnect structure containing copper metallization covered by a HDP cap layer, after exposure to a sulfuric/peroxide solution.

Formation of seams in the HDP CVD capping layer creates various problems, such as copper leakage, copper oxidation, resist poisoning, and blockage of via opening. For example, FIG. 2 shows a picture of an interconnect structure containing copper metallization covered by a conventional HDP CVD capping layer. After this structure was exposed to a sulfuric/peroxide solution (containing sulfuric acid and hydroperoxide), severe attack of the copper metallization line through seams in the HDP CVD capping layer was observed.

U.S. Patent Application Publication No. 2003/0134499 describes a bilayer HDP CVD/PE CVD cap, which comprises a first cap layer formed by a conventional HDP CVD process, and a second cap layer formed by a plasma-enhanced chemical vapor deposition (PE CVD) process. The second cap layer formed by the PE CVD process provides seamless coverage over the underlying structure and therefore mitigates the problems associated with the presence of seams in the first HDP CVD cap layer. Such a bilayer cap structure advantageously exhibits both superior electromigration protection and adhesion characteristics of a HDP CVD film, and the superior coverage characteristic of a PE CVD film.

Figure 3:
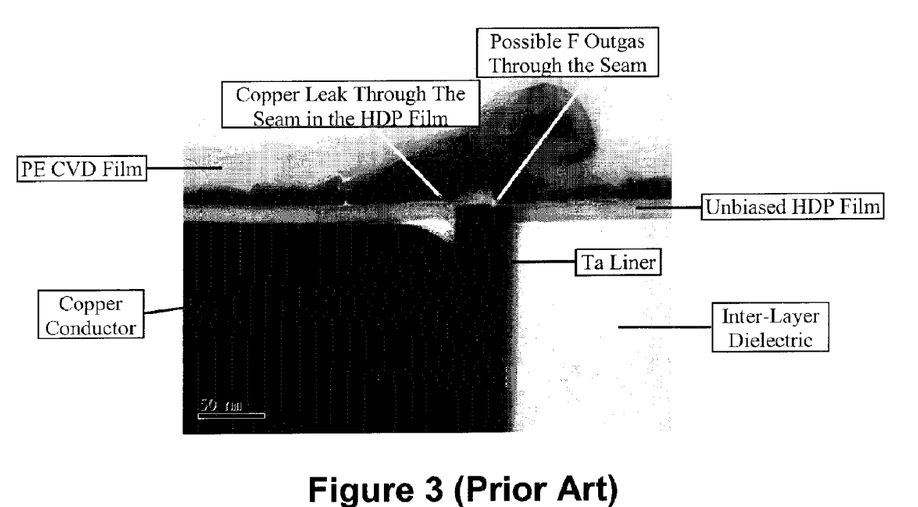
FIG. 3 shows a cross-sectional-view TEM picture of an interconnect structure containing a bilayer cap as described by U.S. Patent Application Publication No. 2003/0134499.

However, in the bilayer cap structure described by U.S. Patent Application Publication No. 2003/0134499, a small amount of copper can still leak through the seams in the first HDP CVD cap layer to form copper dendrites between the first and the second cap layers, and fluorine contained in the inter-layer dielectric material formed of fluorinated silica glass (FSG) may also diffuse through such seams, as shown in FIG. 3.

Further, a low level of resist poisoning still exists in such a bilayer cap structure, because the PE CVD cap layer has a low reactive ion etching (RIE) selectivity over the inter-layer dielectric (ILD) oxide. Consequently, a portion (or a large portion) of the PE CVD cap layer may be deleteriously removed by via RIE, which leads to exposure (or partially exposing) of the seams of the underlying HDP film to subsequent processing steps.

Figure 4:
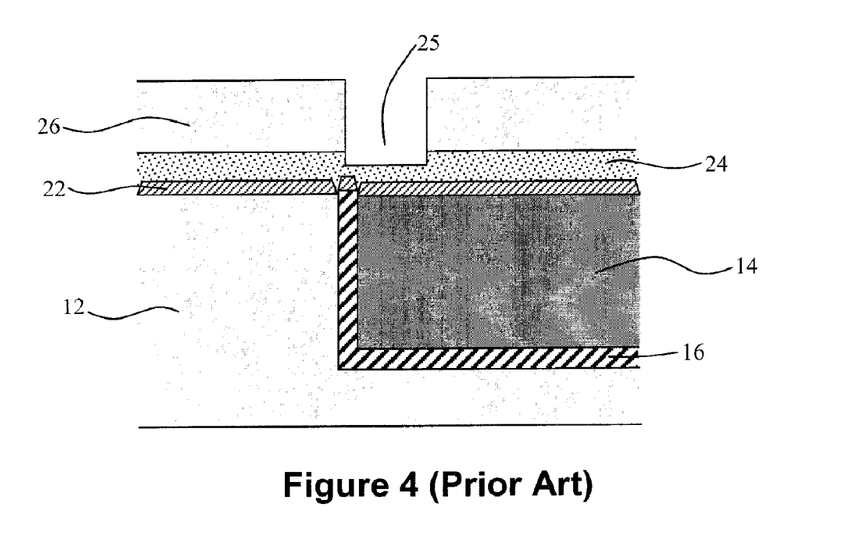
FIG. 4 shows a cross-sectional schematic view of an interconnect structure containing a bilayer cap as described by U.S. Patent Application Publication No. 2003/0134499, after a via opening step during which RIE process was used.

FIG. 4 shows an interconnect structure that contains a first ILD layer 12 having a copper conductor 14 and a tantalum liner 16 embedded therein. A bilayer cap structure as described by U.S. Patent Application Publication No. 2003/0134499 is provided to cap the upper surface of the copper conductor 14. Such bilayer cap structure comprises a first HDP CVD cap layer 22 and a second, seamless PE CVD cap layer 24. A second ILD layer 26 is provided over the PE CVD cap layer 24, for forming additional interconnect structures therein. Because the PE CVD layer 24 has a low RIE selectivity over the ILD layer 26, when a RIE process is carried out to form a via 25 through the ILD layer 26, the underlying PE CVD layer 24 may be partially removed, or even completely punched through, exposing the seams in the underlying HDP CVD cap layer 22.

Moreover, the HDP CVD and the PE CVD processes required for fabricating the bilayer cap structure described by U.S. Patent Application Publication No. 2003/0134499 must be carried out in at least two different reactors, one for HDP CVD and the other for PE CVD, and additional wafer handling and transporting equipment is also needed for moving the wafer from one reactor to the other. Therefore, fabrication of this prior art bilayer cap structure involves complex processing steps with significantly increased processing time and manufacturing costs.

There is a continuing need for providing improved cap structures for semiconductor devices containing copper interconnects or other metal interconnects at lower costs.

SUMMARY OF THE INVENTION

The present invention in one aspect relates to a bilayer cap structure located on an interconnect structure, comprising:

a first cap layer overlaying the interconnect structure, where the first cap layer is formed by an unbiased high density plasma (HDP) chemical vapor deposition process; and a second cap layer overlaying the first cap layer, where the second cap layer is formed by a biased high density plasma (bHDP) chemical vapor deposition process.

The terms "HDP," "unbiased HDP," and "unbiased high density plasma" are used in an interchangeable manner to refer to a high density plasma chemical vapor deposition process in which no bias power or voltage is applied to the substrate during the deposition.

The terms "bHDP," "biased HDP," and "biased high density plasma" are used in an interchangeable manner to refer to a high density plasma chemical vapor deposition process in which a bias power or voltage is applied to the substrate during the deposition.

It is important to note that the different deposition processes as discussed herein result in cap layers that differ significantly in structures as well as other physical properties. For example, a cap layer formed by the unbiased HDP process is characterized by superior electromigration protection, good adhesion to the underlying metal interconnects, and high RIE selectivity over the inter-layer dielectric material; however, it has a columnar growth pattern and contains seams formed along the micro-steps on the substrate surface. A cap layer formed by a PE CVD process is seamless, but it has poor adhesion to the underlying metal interconnects and low RIE selectivity. A cap layer formed by a biased HDP process, on the other hand, has an isotropic growth pattern and a sufficiently high density, as discussed in greater details hereinafter, so it can provide, not only seamless coverage to the underlying structures, but also high RIE selectivity over the inter-layer dielectric material.

In another aspect, the present invention relates to a method for forming a bilayer cap structure over an interconnect structure, comprising the steps of:

depositing a first cap layer over the interconnect structure by an unbiased high density plasma (HDP) chemical vapor deposition process; and depositing a second cap layer over the first cap layer by a biased high density plasma (bHDP) chemical vapor deposition process.

In a further aspect, the present invention relates to a method for forming an interconnect structure over a substrate, comprising the steps of:

forming a dielectric layer over the substrate;

forming at least one conductor in the dielectric layer;

depositing a first cap layer over the dielectric layer and the conductor by an unbiased high density plasma (HDP) chemical vapor deposition process; and depositing a second cap layer over the first cap layer by a biased high density plasma (bHDP) chemical vapor deposition process.

Other aspects, features and advantages of the invention will be more fully apparent from the ensuing disclosure and appended claims.

DETAILED DESCRIPTION OF THE INVENTION, AND PREFERRED EMBODIMENTS THEREOF

The following U.S. patent applications are incorporated herein by reference in their entireties for all purposes:

U.S. patent application Ser. No. 10/047,964 filed on Jan. 15, 2002 for "BILAYER HDP CVD/PE CVD CAP IN ADVANCED BEOL INTERCONNECT STRUCTURES AND METHOD THEREOF," which was published on Jul. 17, 2003 as U.S. Patent Application Publication No. 2003/0134499;

U.S. patent application Ser. No. 10/650,890 filed on Aug. 28, 2003 for "BILAYER HDP CVD/PE CVD CAP IN ADVANCED BEOL INTERCONNECT STRUCTURES AND METHOD THEREOF," which was published on Jun. 17, 2004 as U.S. Patent Application Publication No. 2004/0115873; and U.S. patent application Ser. No. 10/870,029 filed on Mar. 23, 2004 for "BILAYER HDP CVD/PE CVD CAP IN ADVANCED BEOL INTERCONNECT STRUCTURES AND METHOD THEREOF," which was published on Sep. 9, 2004 as U.S. Patent Application Publication No. 2004/0173907.

Figure 5:
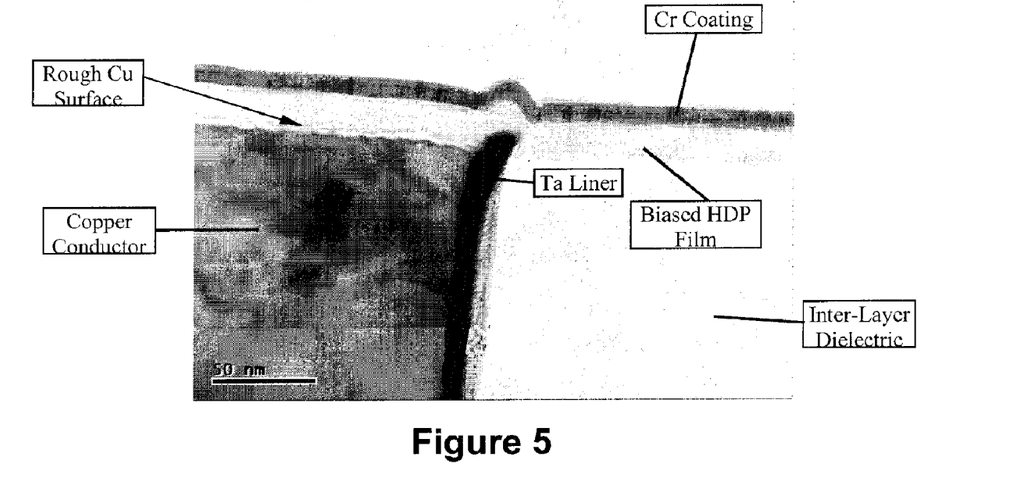
FIG. 5 shows a cross-sectional-view TEM picture of an interconnect structure containing a biased HDP cap layer.

Although silicon nitride films formed by a HDP process are typically characterized by a columnar growth pattern, the applicants of the present invention have discovered that by applying a relatively low bias power (i.e., having a power density in a range from about 0.5 W/cm$^2$ to about 3 W/cm$^2$) to the substrate during the deposition, one can readily change the columnar growth of such films into isotropic growth, i.e., both in the vertical direction and in the horizontal or lateral direction, to form a seamless biased HDP cap layer, as shown in the TEM image of FIG. 5.

The substrate bias power increases ion bombardment on the substrate surface, by providing a biased electrical field that accelerates the speed of depositing ions towards the substrate surface. The high energy flux of depositing ions increases the lateral movement of atoms along the surface of the growing film and changes the columnar growth pattern to isotropic growth pattern. Further, the ion bombardment causes resputtering of the already-deposited capping material. If the substrate bias is sufficiently negative, the kinetic energy of the depositing ions will be sufficient to sputter the film and redistribute it along the deposition surface, thereby filling the already-formed seams in the growing film.

Moreover, the biased HDP cap layer is relatively denser than the PE CVD cap layer and therefore has a significantly higher etching or RIE selectivity over the inter-layer dielectric material, in comparison with a cap layer formed by a PE CVD process.

Figure 6:
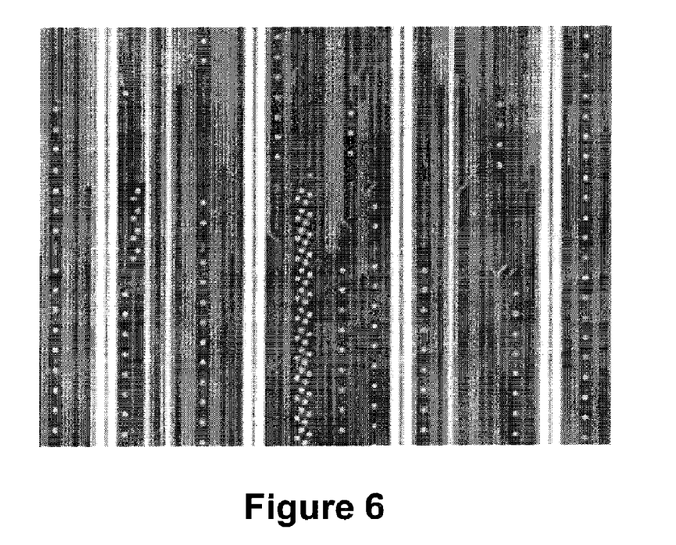
FIG. 6 shows a top-view microscopic picture of an interconnect structure containing copper metallization covered by a biased HDP cap layer, after exposure to a sulfuric/peroxide solution.

FIG. 6 shows a top-view microscopic image of an interconnect structure that contains copper metallization covered by a biased HDP cap layer. Such a biased HDP film was formed by a biased HDP process, during which a substrate AC bias power of about 300 W was applied to a 200 mm tool. After exposure to a sulfuric/peroxide solution (containing about 50% $H_2O$, 30% $H_2SO_4$, and 7% $H_2O_2$ by total volume of the solution at 35° C.), no significant attack to the copper metallization in the interconnect structure was observed.

One problem associated with the biased HDP cap layer is that direct deposition of such a biased HDP cap layer on the interconnect structure containing copper metallization results in a rough copper surface, as shown in FIG. 5. Such a rough copper surface is caused by resputtering of copper on the substrate surface under the impact of enhanced ion bombardment, and it may cause poor adhesion to the underlying copper interconnect. In addition, re-deposition of Cu metal to the nearby dielectric surface due to the re-sputtering could result in small leakage current between the Cu metal line, which leads to a reliability problem, such as time dependent dielectric breakdown (TDDB).

The present invention solves such a problem by providing a bilayer cap structure comprising a first HDP cap layer directly deposited over the copper interconnect and a second bHDP cap layer deposited over the first HDP cap layer. Such a bilayer cap structure advantageously exhibits superior electromigration protection, excellent adhesion to the underlying interconnect structure, seamless coverage, high packing density, and high RIE selectivity.

Specifically, the first HDP cap layer may be comprised of silicon nitride, silicon carbide, boron nitride, or other suitable dielectric diffusion barrier materials. Preferably, the first HDP cap layer is comprised of silicon nitride having a composition containing from about 30 to about 50 atomic % silicon, from about 40 to about 65 atomic % nitrogen, and from about 5 to about 13 atomic % hydrogen. A particularly preferred composition for the first HDP cap layer comprises about 40 atomic % silicon, about 52 atomic % nitrogen, and about 8 atomic % hydrogen. The first HDP cap layer preferably has a thickness in the range from about 5 nm to about 30 nm, and more preferably from about 5 nm to about 20 nm.

The second bHDP cap layer may be comprised of silicon nitride, silicon carbide, boron nitride, or other suitable dielectric diffusion barrier materials. The second bHDP cap layer may comprise the same or different material as the first HDP cap layer. Preferably, the second bHDP cap layer is comprised of silicon nitride having a composition containing from about 30 to about 50 atomic % silicon, from about 40 to about 65 atomic % nitrogen, and from about 5 to about 25 atomic % hydrogen. A particularly preferred composition for the second bHDP cap layer is about 37 atomic % silicon, about 48 atomic % nitrogen, and about 15 atomic % hydrogen. The second bHDP cap layer preferably has a thickness in the range from about 10 nm to about 100 nm, and more preferably form about 10 nm to about 35 nm.

The first HDP cap layer, which preferably comprises a HDP silicon nitride film, is deposited in a HDP CVD reactor under a vacuum condition, i.e., at a pressure in the range from about 0.1 to about 50 millitorr, more preferably from about 5 to about 20 millitorr. The deposition gases may include, but are not limited to, $SiH_4$, $N_2$, and Ar or He. A typical HDP CVD deposition uses a flow of $SiH_4$ in the range from about 5 to about 125 sccm, a flow of $N_2$ in the range from about 50 to about 1000 sccm, and a flow of Ar in the range from about 20 to about 1000 sccm. The deposition temperature is typically in the range from about 200° C. to about 500° C., with a preferred range of from about 300° C. to about 400° C.

Following deposition of the first HDP cap layer, the second bHDP cap layer, which preferably comprises a bHDP silicon nitride film, is deposited in the same HDP CVD reactor under substantially similar deposition conditions, except that a bias power is applied to the substrate during deposition of the second bHDP cap layer. The vacuum can be broken between the two deposition processes, but it is preferred that the depositions be performed without breaking the vacuum between depositions.

Because the first and the second cap layers of the bilayer cap structure of the present invention can be formed in the same reactor with simple modification of the deposition conditions, the complexity of the manufacturing process of such a bilayer cap structure is significantly reduced, in comparison with that for the bilayer cap structure described by U.S. Patent Application Publication No. 2003/0134499, which leads to reduced manufacturing costs and processing time. More importantly, depositions of the first HDP and the second bHDP cap layers can be carried out in a continuous manner, without breaking the vacuum between depositions, which effectively prevents leakage of copper from the seams in the first HDP cap layer before the second bHDP cap layer is deposited. Consequently, the bilayer cap structure of the present invention, unlike the prior art bilayer cap described by U.S. Patent Application Publication No. 2003/0134499, is devoid of possible formation of copper dendrites between the first and second cap layers.

The substrate bias power employed by the biased HDP process of the present invention is preferably an AC power with a relatively low power density from about 0.5 to about 3 W/cm$^2$.

It is a surprise and unexpected discovery of the present invention that a substrate bias having a power density as low as 0.5 W/cm$^2$ is sufficient for forming bHDP silicon nitride films of superior seam coverage, good conformity, and high RIE selectivity. In fact, if the power density of the substrate bias power is too high, i.e., above 3 watts/cm$^2$, the underlying copper metallization can be overheated, causing damages to the interconnect structure. Furthermore, excessively high biased power could result in charge damage to the device and lead to a yield lost. Therefore, by controlling the power density of the substrate bias within the range from about 0.5 to about 3 W/cm$^2$, a high quality bHDP cap layer can be formed with little or no damage to the underlying interconnect structure. For example, for a wafer of about 200 mm in diameter, the substrate bias power is preferably within the range from about 150 W to about 950 W, and more preferably from about 200 W to about 600 W. On the other hand, for a wafer of about 300 mm in diameter, the substrate bias power is preferably within the range from about 350 W to about 2150 W, and more preferably from about 600 W to about 1500 W.

Preferably, but not necessarily, substrate-cooling mechanisms that are well known to one ordinarily skilled in the art may be employed to compensate for the heating effect associated with the substrate bias and to maintain the substrate temperature at below 500° C. (more preferably below 400° C.) during the biased HDP process. For example, the wafer substrate can be held by a clamp, while helium gas is flowed onto the backside of the wafer substrate to cool the substrate during the bHDP process, which is usually referred to as backside helium cooling.

Figure 7:
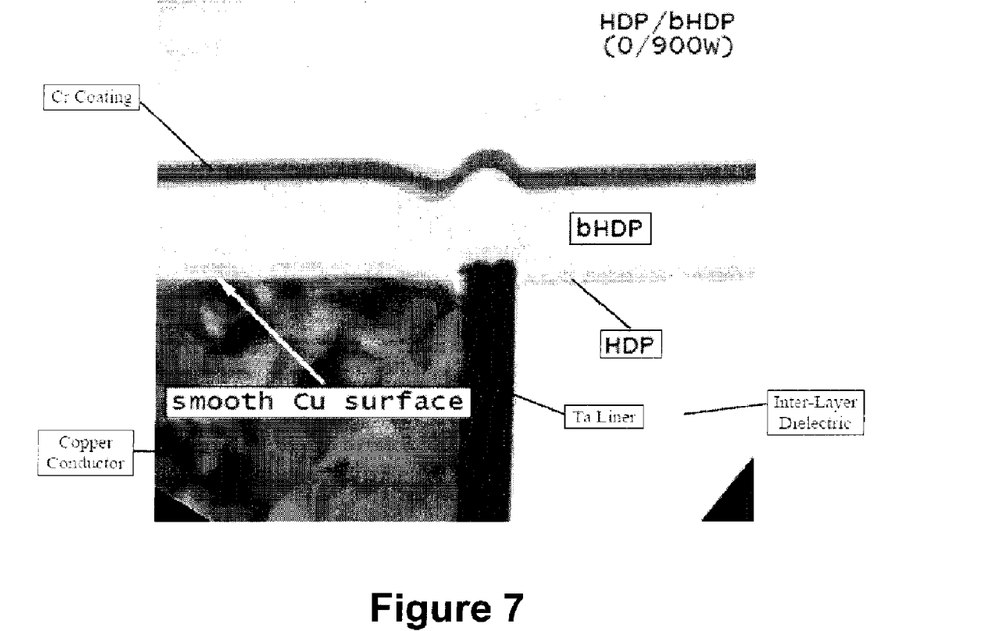
FIG. 7 shows a cross-sectional-view TEM picture of an interconnect structure containing a bilayer cap with a first cap layer formed by an unbiased HDP process and a second cap layer formed by a biased HDP process with a substrate bias power of about 900 watts, according to one embodiment of the present invention.

FIG. 7 shows a cross-section TEM image of an interconnect structure formed in a 300 mm wafer. The interconnect structure contains a bilayer HDP/bHDP cap structure, for capping a copper conductor that is embedded in an ILD material with a conductive tantalum liner therebetween. Specifically, such bilayer cap structure comprises a first cap layer formed by an unbiased HDP process (i.e., with a substrate bias power of 0 W), and a second cap layer formed by a biased HDP process where an AC bias power of about 900 W was applied to the wafer substrate.

As shown in FIG. 7, the first HDP cap layer has a columnar growth pattern, with seams formed along the micro-steps between the top surfaces of the copper conductor, the Ta liner, and the ILD material. The second bHDP cap layer has a seamless, isotropic growth pattern, and it completely covers over the seams in the first HDP cap layer.

Further, the copper surface underlying such bilayer HDP/bHDP cap structure is much more smooth, in comparison with that in FIG. 5, suggesting that little or no copper resputtering has occurred during the fabrication of the bilayer cap structure of the present invention. Moreover, there are no copper dendrite structures between the first HDP layer and the second bHDP layer, indicating that no copper leakage has occurred after deposition of the first HDP layer and before the second bHDP layer is formed.

Figure 8:
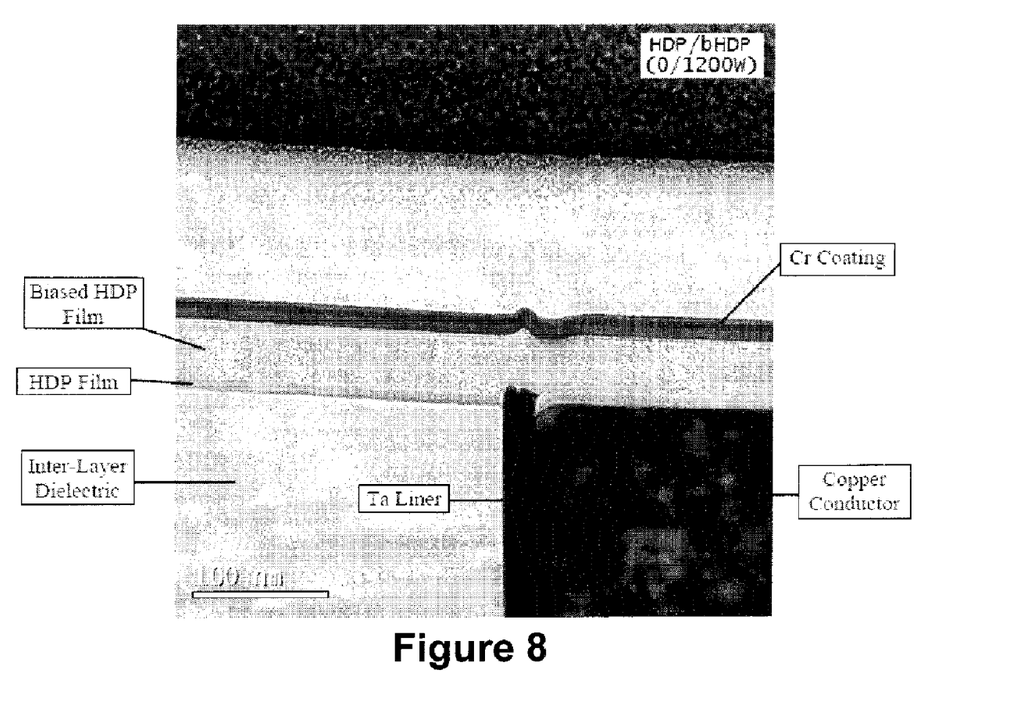
FIG. 8 shows a cross-sectional-view TEM picture of an interconnect structure containing a bilayer cap with a first cap layer formed by an unbiased HDP process and a second cap layer formed by a biased HDP process with a substrate bias power of about 1200 watts, according to one embodiment of the present invention.

FIG. 8 shows a cross-section TEM image of another interconnect structure formed in a 300 mm wafer, which contains a bilayer HDP/bHDP cap structure with a second cap layer formed by a biased HDP process where an AC bias power of about 1200 W was applied to the wafer substrate.

Figure 9:
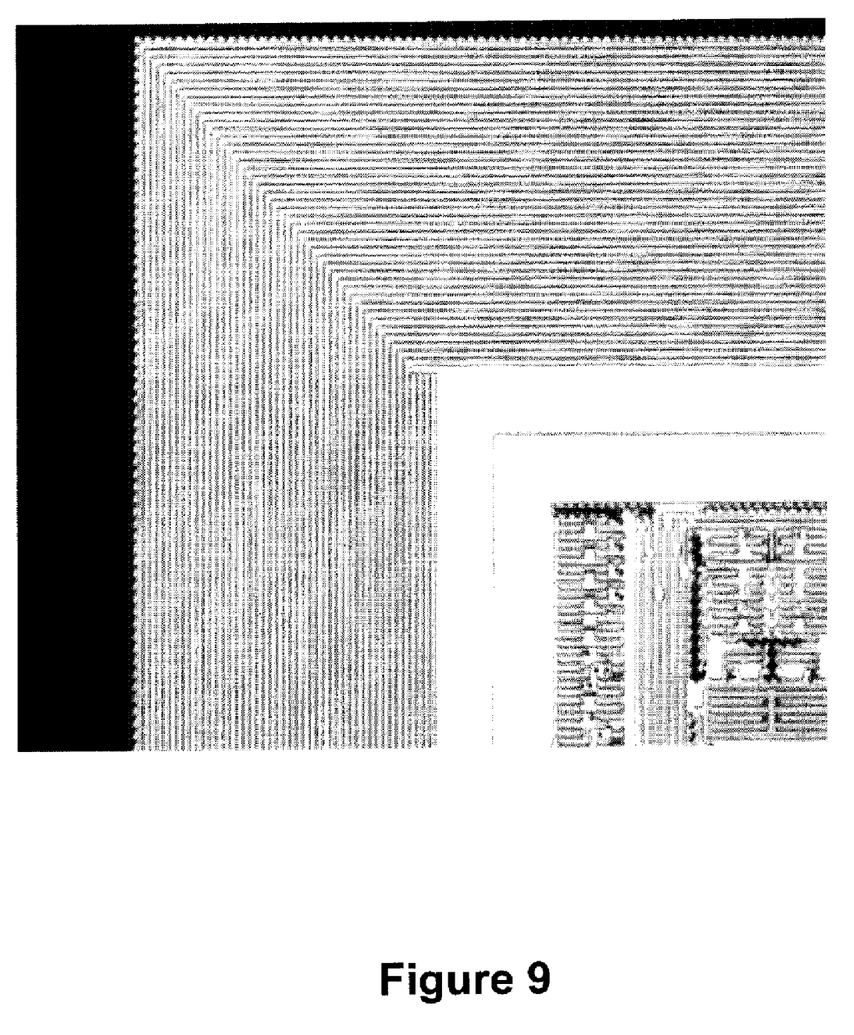
FIG. 9 shows a top-view microscopic picture of an interconnect structure containing copper metallization covered by a bilayer cap structure with a first HDP cap layer and a second bHDP cap layer, after exposure to a sulfuric/peroxide solution.

FIG. 9 shows a top-view microscopic image of an interconnect structure formed in a 300 mm wafer and having copper metallization covered by a bilayer HDP/bHDP cap structure of the present invention. The bHDP cap layer in the bilayer cap structure was formed by a biased HDP process with about a 900 W AC substrate bias power. After exposure to the sulfuric/peroxide solution, the copper metallization showed little or no attack by the solution, suggesting that the bilayer HDP/bHDP cap structure provided excellent coverage to the underlying copper conductor lines.

Since the bHDP cap layer comprises non-conducting diffusion barrier material, such as silicon nitride, silicon carbide, and boron nitride, direct current (DC) substrate bias will cause detrimental accumulation of charged ions on the cap layer surface. Therefore, AC substrate bias is preferably employed in the present invention to avoid charge accumulation. Specifically, while such AC substrate bias is negative, positive ions continuously bombard the cap layer surface to densify the growing film and cause resputtering of the capping material to fill the seams already formed in the growing film. When the AC substrate bias is positive, the charge accumulated on the surface of the cap layer during the negative substrate bias is discharged. Therefore, the alternating directions of the AC substrate bias allow formation of a dense, seamless bHDP cap layer, with little or no charge accumulation.

Figure 10:
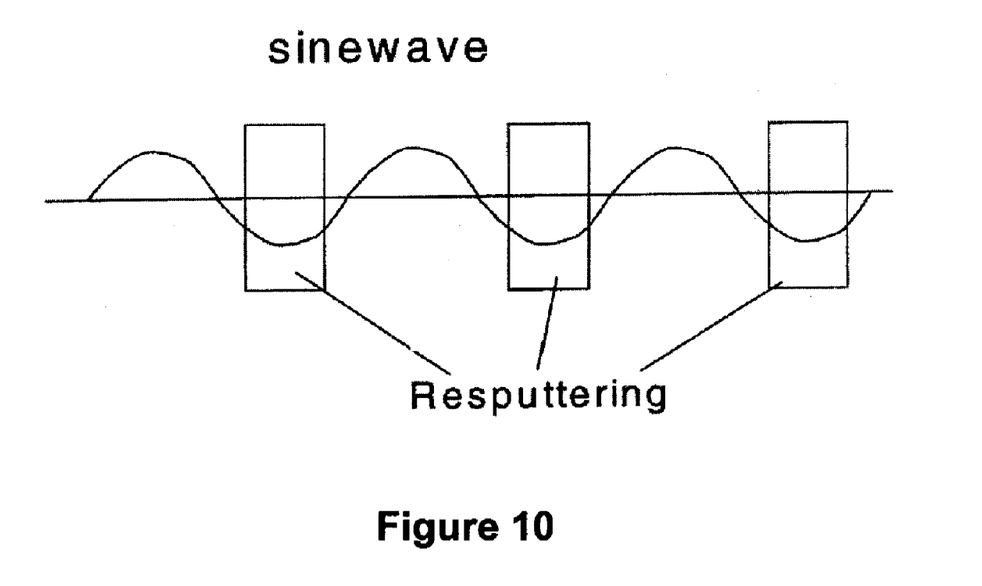
FIG. 10 illustrates resputtering of capping material during a biased HDP process where an alternative current (AC) bias with a sine wave was applied to the substrate.
Figure 11:
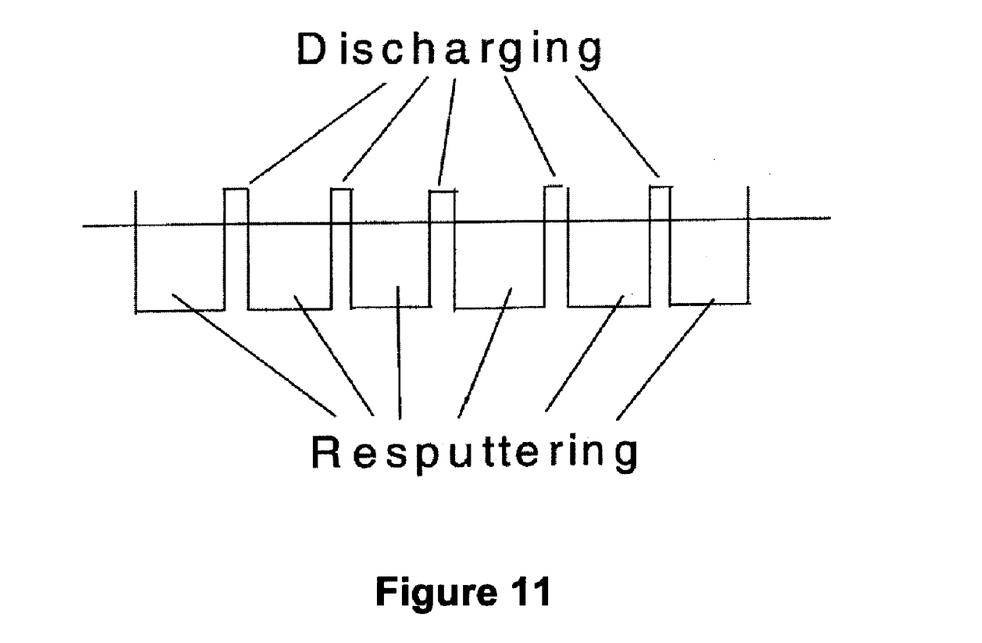
FIG. 11 illustrates resputtering of capping material during a biased HDP process where an alternative current (AC) bias with a square wave was applied to the substrate.

The AC substrate bias power employed by the present invention may have either a sine wave similar to that shown in FIG. 10, or a square wave similar to that shown in FIG. 11.

While a sine wave AC substrate bias is used, resputtering of the capping material occurs during the time when the substrate bias power is sufficiently negative to effectuate ion bombardment on the substrate surface, which is about only a quarter of the entire deposition period, as shown by the rectangular boxes in FIG. 10. The bias power may be increased in order to enhance the resputtering rate for such sine wave AC substrate bias, but the increased bias power can cause damage to the thin bHDP cap layer as well as to the underlying metallization, as described hereinabove.

Therefore, an AC substrate bias with an asymmetric square wave, as shown in FIG. 11, can be used to increase the resputtering time and reduce the substrate bias power. In such square wave bias, a negative voltage is applied to the substrate for an extended period of time (about 80%–95% of the total deposition time) to effectuate resputtering of the capping material, which is followed by a sharp positive voltage peak that can discharge the substrate surface within a very short time period (about 5%–20% of the total deposition time). Therefore, the resputtering time can be significantly increased, by using such square wave AC substrate bias, which allows further reduction of the bias power.

The ILD material as mentioned hereinabove may be any suitable dielectric material, although low-k dielectric materials having a dielectric constant of less than 3.5 are preferred. Suitable dielectric materials include carbon-doped silicon dioxide materials, fluorinated silicate glass (FSG), organic polymeric thermoset materials, silicon oxycarbide, SiCOH dielectrics, fluorine doped silicon dioxide, spin-on glasses, silsesquioxsanes, including hydrogen silsesquioxane (HSQ), methyl silsesquioxane (MSQ) and mixtures or copolymers of HSQ and MSQ and mixtures or copolymers of HSQ and MSQ, benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available form Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). Preferred dielectric materials are organic polymeric thermoset materials, consisting essentially of carbon, oxygen, and hydrogen. Preferred dielectric materials include the low-k polyarylene ether polymeric material known as SiLK™ (available from the Dow Chemical Company), and the low-k polymeric material known as FLARE™ (available from Honeywell).

The conductive diffusion barrier liners as mentioned hereinabove may comprise tantalum, titanium, tungsten, and any other conductive material capable of preventing or reducing diffusion of metal atoms from the metal interconnects, or the nitrides of these conductive materials.

Although the above description is provided primarily in terms of copper-based interconnect structures, for simplicity and illustration purposes, the present invention is not so limited, and it is broadly applicable to interconnect structures containing any type of conductive material, with or without modifications and variations, as readily determinable by a person ordinarily skilled in the art according to the principles described herein. The interconnect structures can be formed utilizing procedures that are well known in the art. For example, a single or dual damascene process can be used in forming the interconnect structures.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. An interconnect structure, comprising:
   a conductor embedded in an interlevel dielectric (ILD) material with a conductive diffusion barrier liner therebetween, wherein top surfaces of the conductor, the ILD material, and the conductive diffusion barrier liner comprise micro-steps therebetween; and
   a bilayer cap structure comprising:
      a first cap layer overlaying the conductor, the ILD material, and the conductive diffusion barrier liner, wherein said first cap layer is formed by an unbiased high density plasma (HDP) chemical vapor deposition process and has a columnar growth pattern with seams located along the micro-steps between the top surfaces of the conductor, the ILD material, and the conductive diffusion barrier liner; and
      a second cap layer overlaying the first cap layer, wherein said second cap layer is formed by a biased high density plasma (bHDP) chemical vapor deposition process and has a seamless, isotropic growth pattern.

2. The interconnect structure of claim 1, wherein the first cap layer comprises a dielectric material selected from the group consisting of silicon nitride, silicon carbide, and boron nitride.

3. The interconnect structure of claim 1, wherein the second cap layer comprises a dielectric material selected from the group consisting of silicon nitride, silicon carbide, and boron nitride.

4. The interconnect structure of claim 1, wherein the first and second cap layers both comprises silicon nitride.

5. The interconnect structure of claim 1, devoid of any metal dendrite structure between the first cap layer and the second cap layer.

6. The interconnect structure of claim 1, wherein the first cap layer has a thickness in a range from about 5 nm to about 30 nm, and wherein the second cap layer has a thickness in a range from about 10 nm to about 100 nm.

7. A method for forming a bilayer cap structure over an interconnect structure, comprising the steps of:
   forming an interconnect structure comprising a conductor embedded in an interlevel dielectric (ILD) material with a conductive diffusion barrier liner therebetween, wherein top surfaces of the conductor, the ILD material, and the conductive diffusion barrier liner comprise micro-steps therebetween;
   depositing a first cap layer over the interconnect structure by an unbiased high density plasma (HDP) chemical vapor deposition process, wherein the first cap layer has a columnar growth pattern with seams located along the micro-steps between the top surfaces of the conductor, the ILD material, and the conductive diffusion barrier liner; and
   depositing a second cap layer over the first cap layer by a biased high density plasma (bHDP) chemical vapor deposition process, wherein the second cap layer has a seamless, isotropic growth pattern.

8. The method of claim 7, wherein the bHDP chemical vapor deposition process includes the step of applying an AC bias power having a power density in a range from about 0.5 W/cm$^2$ to about 3 W/cm$^2$ onto the substrate.

9. The method of claim 8, wherein the AC bias power is characterized by a square wave that provides a negative charge for from about 80% to about 95% of the total time of the bHDP chemical vapor deposition process, and a positive charge for from about 5% to about 20% of the total time of the bHDP chemical vapor deposition process.

10. The method of claim 7, wherein the bHDP chemical vapor deposition process is conducted at a deposition temperature in a range from about 200° C. to about 400° C.

11. The method of claim 10, wherein the substrate is cooled during said bHDP chemical vapor deposition process via backside cooling.

12. The method of claim 7, wherein the first cap layer comprises a dielectric material selected from the group consisting of silicon nitride, silicon carbide, and boron nitride.

13. The method of claim 7, wherein the second cap layer comprises a dielectric material selected from the group consisting of silicon nitride, silicon carbide, and boron nitride.

14. The method of claim 7, wherein the first and second cap layers both comprises silicon nitride.

15. The method of claim 7, wherein the first cap layer has a thickness in a range from about 5 nm to about 30 nm, and wherein the second cap layer has a thickness in a range from about 10 nm to about 100 nm.

* * * * *